United States Patent
Bertram et al.

(10) Patent No.: US 7,750,357 B2
(45) Date of Patent: Jul. 6, 2010

(54) LED WITH IMPROVED LIGHT EMITTANCE PROFILE

(75) Inventors: Dietrich Bertram, Aachen (DE); Helmut Bechtel, Roetgen (DE); Wolfgang Busselt, Roetgen (DE); Horst Greiner, Aachen (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 578 days.

(21) Appl. No.: 11/570,897

(22) PCT Filed: Jun. 21, 2005

(86) PCT No.: PCT/IB2005/052027

§ 371 (c)(1), (2), (4) Date: Dec. 19, 2006

(87) PCT Pub. No.: WO2006/000986

PCT Pub. Date: Jan. 5, 2006

(65) Prior Publication Data

US 2008/0277680 A1    Nov. 13, 2008

(30) Foreign Application Priority Data

Jun. 25, 2004    (EP) ................... 04102953

(51) Int. Cl.
    *H01L 33/00*    (2010.01)
(52) U.S. Cl. .................. 257/98; 257/E33.073
(58) Field of Classification Search ............ 257/98, 257/E33.073
See application file for complete search history.

(56) References Cited

U.S. PATENT DOCUMENTS

| 2001/0033135 A1 | 10/2001 | Duggal et al. |
| 2002/0001681 A1 | 1/2002 | Arai et al. |
| 2008/0277680 A1* | 11/2008 | Bertram et al. ............... 257/98 |

FOREIGN PATENT DOCUMENTS

| EP | 1116987 A2 | 7/2001 |
| EP | 1167313 A1 | 1/2002 |
| WO | WO9817083 A1 | 4/1998 |
| WO | WO0237580 A1 | 5/2002 |
| WO | WO03061028 A2 | 7/2003 |

OTHER PUBLICATIONS

International Search Report of International Application No. PCT/IB2005/052027 Contained in International Publication No. WO2006000986, Jan. 2006.

Written Opinion of the International Searching Authority for International Application No. PCT/IB2005052027, Jan. 2, 2006.

* cited by examiner

*Primary Examiner*—Mark Prenty

(57) ABSTRACT

An LED includes a substrate layer with a first surface and a second surface opposing the first surface and having a refractive index of $n_1$. A light emitter is provided on the first surface and an array of particles is arranged on the second surface. The index matching layer between the particles on the second surface has a refractive index of $n_2$ being $n_2 \geq n_1 - 0.5$ and $n_2 \leq n_1 + 3$. Further, the filling height of the index matching layer is lower than the maximum height of the array of particles.

19 Claims, 1 Drawing Sheet

LED WITH IMPROVED LIGHT EMITTANCE PROFILE

This invention relates to the field of LED's. In today's LEDs there is usually provided a substrate upon which a light emitting means is provided on a surface of the substrate (furthermore also to be referred to as "first surface". This light emitting means emits light (e.g. by fluorescence of suitable metal ions) which then, after passing the substrate is emitted.

However, the light emitted in the light emitting means is usually not directed, i.e. it is emitted in a variety of directions. Therefore, a certain amount of light is lost due to total reflection on the surface of the substrate which is located on the other side of the first surface, where the light emitting means is located (furthermore also to be referred as "second surface").

Therefore it is an object of the present invention to present a LED in which the loss of light due to the total reflection on the second surface of the surface is lowered.

This object is achieved by a LED comprising a substrate layer with a first surface and a second surface opposing the first surface and having a refractive index of $n_1$, a light emitting means provided on said first surface and an array of particles arranged on said second surface, characterized by an index matching means on said second surface having an refractive index $n_2$ being $n_2 \geq n_1 - 0.5$ and $n_2 \leq n_1 + 3$ and whereby the filling height of the index matching means is lower than the maximum height of the array of particles.

Due to the interaction of the index matching means and the array of particles, the amount of loss due to total reflection is lowered. In some application using a LED according to the present invention, the light emittance can be increased by 20%.

It should be noted, that an arrangement of particles on the second surface of the surface is as such known in the art, e.g. from WO2003061028.

The term "the filling height of the index matching means is lower than the maximum height of the array of particles" means in particular that the index matching means is stacked up or filled on the substrate layer in such a way that not all particles are totally covered and/or surrounded by the index matching means.

Preferably, the refractive index $n_2$ is $n_2 \geq n_1 - 0.2$ and $n_2 \leq n_1 + 2,5$, more preferably $n_2 \geq n_1 - 0.2$ and $n_2 \leq n_1 + 2$.

According to a preferred embodiment of the present invention, the refractive index of the index matching means $n_2$ is $\geq 1.0$ and $\leq 4$. Preferably, the refractive index of the index matching means $n_2$ is $\geq 1.3$ and $\leq 3.7$, most preferred, the refractive index of the index matching means $n_2$ is $\geq 1.5$ and $\leq 3.5$.

According to a preferred embodiment of the present invention, the index matching means is provided in such a way that $\geq 90\%$ and $\leq 100\%$ of the index matching means fills up the array of particles to $\geq 20\%$ and $\leq 80\%$ of the height of the array of particles.

It is preferred that the array of particles is not filled up completely with the index matching means. If there is no filling (i.e no index matching means) there will be losses due to total reflection on the substrate. On the other hand, if the index matching means is filled up to the total height of the array of particles, there will be no proper emittance from the particle layer because total reflection at the index matching means—air interface will redirect light to the emission layer.

Therefore it is preferred that $\geq 30\%$ and $\leq 100\%$ of the index matching means fills up the array of particles to $\geq 20\%$ and $\leq 80\%$ of the height of the array of particles. In this context, the term "filling or stacking of the index matching means to $\geq 20\%$ and $\leq 80\%$ of the height of the array of particles" is to be understood in such a way that at each point between two neighboring particles the height of the index matching means is $\geq 20\%$ and $\leq 80\%$ of the distance of a line of two apexes of neighboring particles and the substrate at this point.

More preferably, $\geq 50\%$ and $\leq 100\%$, yet more preferred $\geq 70\%$ and $\leq 100\%$ and most preferred $\geq 90\%$ and $\leq 100\%$, of the index matching means fills up the array of particles to $\geq 20\%$ and $\leq 80\%$ of the height of the array of particles.

Preferably $\geq 90\%$, more preferably $\geq 95\%$ and most preferred $\geq 99\%$ and $\leq 100\%$ of the index matching means fills up the array of particles to $\geq 20\%$ and $\leq 80\%$, more preferably to $\geq 25\%$ and $\leq 75\%$ and most preferred to $\geq 30\%$ and $\leq 60\%$ of the height of the array of particles.

According to a preferred embodiment of the present invention, the volume filling of the array of particles is $\geq 50\%$ and $\leq 90\%$.

According to the present invention, the volume filling of the array of particles is measured in the following way:

- Either at one point or at several points of the LED, a cross sectional cut of the LED is made (e.g. by breaking the LED). It is preferred that the length of the broken edge is equal or greater than 2000% of the mean particle size in order to use the surface area/s for an approximation of the volumes.
- The apexes of the particles, which are furthest from the substrate layer are interconnected to form a line.
- The area A between this line and the upper edge/upper surface of the substrate layer is calculated.
- Then the partial area PA within the area A, which is filled by either particles and/or index matching means is calculated.
- The volume filling of the array of particles is then $$\frac{PA}{A} * 100\%$$

The measurement of the areas A and PA can e.g. be done via optical microscopy or any other suitable imaging system. Alternatively and/or additionally, X-ray fluorescence analysis or other suitable methods known to the skilled persons in the field can be used to determine the volumetric amounts of particles and filling materials.

The inventors have studied the problems with the loss of light and the volume filling very carefully and came to the following conclusions.

If there is no volume filling whatsoever, a great deal of the light will be lost due to total reflection on the edge and/or upper surface of the substrate layer. Only at the contact surface of substrate and particles light outside the substrate escape cone can enter the scattering layer of particles. However, if the volume filling is too high, there will be no proper emittance from the particle layer because total reflection at the upper edge of the filling will redirect light to the emission layer.

Therefore it is preferred that the volume filling of the particle layer is $\geq 50\%$ and $\leq 90\%$. More preferably the volume filling of the particle layer is $\geq 60\%$ and $\leq 85\%$, most preferred, $\geq 70\%$ and $\leq 80\%$.

According to a preferred embodiment of the present invention, the index matching means has an absorption in the wavelength range of $\geq 380$ to $\leq 700$ nm of $\geq 0$ cm$^{-1}$% and $\leq 1000$ cm$^{-1}$. By doing so, further losses due to the index matching means are limited. Preferably, the absorption in the wavelength range of $\geq 380$ to $\leq 700$ nm of $\geq 0$ cm$^{-1}$ and $\leq 100$ cm$^{-1}$, most preferred the absorption in the wavelength range of $\geq 380$ to $\leq 700$ nm of $\geq 0$ cm$^{-1}$ and $\leq 1$ cm$^{-1}$ According to a preferred embodiment of the present invention, the index matching means comprises a fluid. Preferably the fluid comprises at least one silicon material. Furthermore, it is preferred that the kinematic viscosity of the fluid before curing is $\geq 300$ cSt to $\leq 500$ cSt, more preferably $\geq 350$ to $\leq 450$ cSt. It is also preferred that the refractive index at 590 nm is $\geq 1.40$ to $\leq 1.74$, more preferably $\geq 1.51$ to $\leq 1.63$. The absorption coefficient between 400 and 700 nm is preferably $\geq 0$ to $\leq 0.1$ cm$^{-1}$.

In case a fluid is used as the or one of the index matching means, it is preferred that the fluid is cured during the production of the LED. The curing is preferably done at 60° C. for 1 hour. Preferably the Shore hardness of the fluid (tested according ASTM D-2240) after curing is $\geq 30$ to $\leq 40$, more preferred $\geq 33$ to $\leq 37$. Furthermore it is preferred that the volume shrinkage after the curing is $\geq 0$ to $\leq 6\%$, more preferably $\geq 0$ to $\leq 4\%$ The fluid is preferably applied on the substrate by spin-casting and/or drop-casting and/or doctor blading. These methods have proven themselves to be most suitable. After application, the fluid is preferably hardened by temperature, light exposure or chemical reaction.

According to a preferred embodiment of the present invention, the index matching means comprises small particles (also to be referred to as index matching particles), whereby the diameter of the index matching particles is $\geq 1$ nm and $\leq 50$ nm. Preferably, the diameter of the index matching particles is $\geq 5$ nm and $\leq 30$ nm, most preferred diameter of the index matching particles is $\geq 10$ nm and $\leq 20$ nm. The ratio (by volume) of the index matching particles to the large particles $R_p$ lies preferably in the range of $0.1 \leq R_p \leq 2$, more preferred $0.2 \leq R_p \leq 1.5$ and most preferred by $0.3 \leq R_p \leq 1$.

According to another preferred embodiment of the present invention, the index matching means comprises particles and a fluid. In some applications, this has also led to a significant increase in light emittance of the LED.

According to a preferred embodiment of the present invention, the index matching means comprises a fluid and/or particles with a material selected from a group comprising glass, silicone, polymers, epoxies, inorganic materials, preferably selected from (metal-oxides, and/or -fluorides, and/or -phosphates, and/or -nitrides, and/or -silicates) with an refractive index of $\geq 1.0$ and $\leq 3.5$, inorganic polymers, organic polymers, preferably with an refractive index of $\geq 1.0$ and $\leq 3.5$ or mixtures thereof. These materials have proven themselves to be most efficient in practice.

According to a preferred embodiment of the present invention, the array of particles is provided in such a way that $\geq 70\%$ to $\leq 100\%$ of the particles form a single-layered array on the substrate. This arrangement, together with the index matching means has proven to be most efficient. More preferably $\geq 80\%$, most preferred $\geq 90\%$ to $\leq 100\%$ of the particles form a single-layered array on the substrate.

According to a preferred embodiment of the present invention, the particles that form the array of particles have an average diameter which is $\geq 40$ nm and $\leq 1000$ μm. Preferably, the average diameter of said particles is $\geq 100$ and $\leq 400$ μm. Most preferred, the average particle diameter is $\geq 1000$ nm and $\leq 300$ μm. This has proven to be most effective in practice. Preferably, the average diameter of said particles is $\geq 100$ and $\leq 400$ nm. Most preferred, the average particle diameter is $\geq 120$ nm and $\leq 300$ nm. This has proven to be most effective in practice.

An LED according to the present invention can be used in a variety of systems amongst them systems being household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, and decorative lighting systems.

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object of the invention are disclosed in the sub-claims and the following description of the respective figures—which in an exemplary fashion—show several preferred embodiments of the LED according to the invention.

Figure 1:
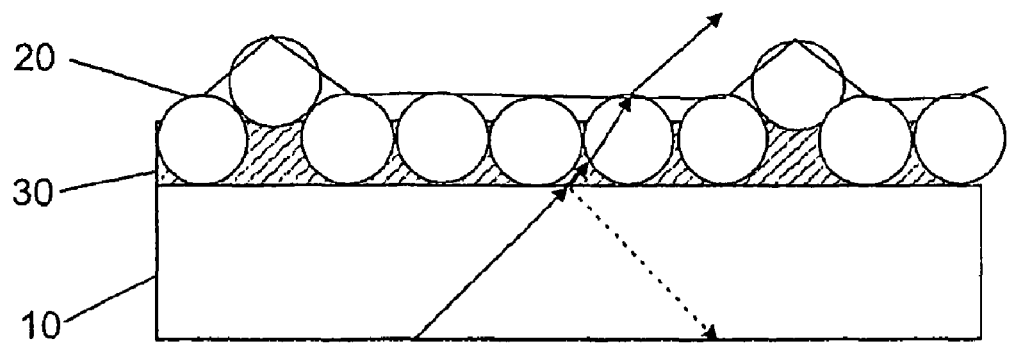
FIG. 1 shows a very schematic partial cross-sectional view of an LED according to a first embodiment of the present invention.
Figure 2:
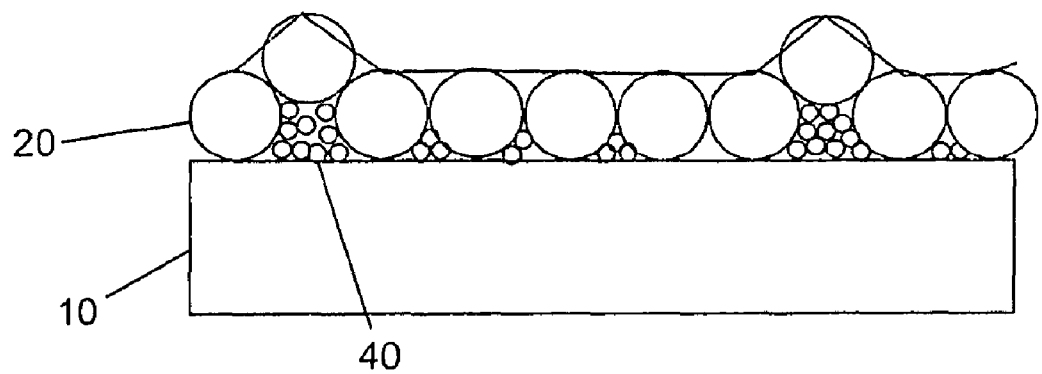
FIG. 2 shows a very schematic partial cross-sectional view of an LED according to a second embodiment of the present invention.
Figure 3:
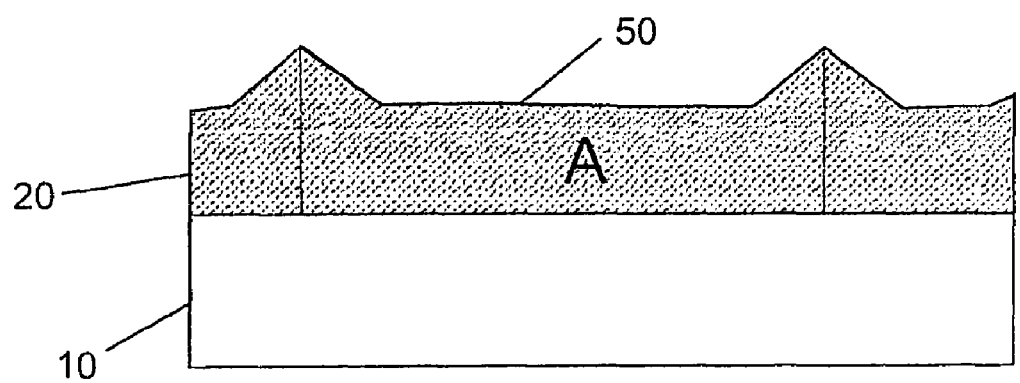
FIG. 3 shows a very schematic partial cross-sectional view, illustrating the area A for the first and second embodiment.

FIGS. 1 and 2 show very schematic partial cross-sectional views of a LED according to a first and second embodiment of the present invention. In both embodiments, the LED comprises a substrate 10, which is usually a glass substrate and an array of particles 20 arranged on the substrate 10. For illustration purposes, the array of particles is identical for both FIG. 1 and FIG. 2, respectively. FIG. 3 shows the area A, which is used for measuring the volume filling, which is the area between a line connecting the apexes of the particles and the upper edge/upper surface of the substrate layer. For better understanding, the line connecting the apexes of the particles is also shown in FIGS. 1 and 2. It should be noted that in the embodiments shown, there is (more or less) only one layer of particles. However, the invention is also applicable in case that more than one layer of particles is present. In this case, the line which is used for calculating the area A would be constructed by interconnecting the apexes of the particles which are furthest from the substrate layer.

FIG. 1 shows a first embodiment, where an index matching means in form of a fluid 30 has been brought up on the substrate. As can be seen, volume filling of the embodiment of FIG. 1 is approx. 85%. The material of the index matching means 30 is preferably selected from a group comprising glass, silicone, inorganic materials with an refractive index of $\geq 1.0$ and $\leq 3.5$, inorganic polymers, organic polymers, preferably with an refractive index of $\geq 1.0$ and $\leq 3.5$ or mixtures thereof.

As can be seen from FIG. 1, the index matching means is provided in such a way that $\geq 90\%$ and $\leq 100\%$ of the index matching means fills up the array of particles to $\geq 20\%$ and $\leq 80\%$ of the height of the array of particles. Although the height of the array of particles varies (since two particles are located farther away from the substrate), the filling height of the index matching means is always $\geq 20\%$ and $\leq 80\%$.

Indicated by the arrows is the way of a path of light through the substrate 10, index matching means 30 and array of particles 20. As can be seen in FIG. 1, the light falls on the substrate and is then led into the index matching means, from there into the particles and then emitted. Without the index matching means, total reflection would have occurred as indicated by the dotted line. Thus, the index matching means increases the amount of light emitted by the LED.

FIG. 2 shows a second embodiment of the present invention, where an index matching means in form of particles 40 has been provided on the substrate 10. The diameter of the particles is ≧1 nm and ≦50 nm. The volume filling of the embodiment as shown in FIG. 2 is approx. 50%. These index matching particles also serve to increase the amount of light emitted by the LED.

As can be seen from FIG. 2, the index matching means is provided in such a way that ≧90% and ≦100% of the index matching means fills up the array of particles to ≧20% and ≦80% of the height of the array of particles. Although the height of the array of particles varies (since two particles are located farther away from the substrate), the filling height of the index matching means is always ≧20% and ≦80%.

It should be noted, that according to another preferred embodiment of the present invention, also an index matching means which comprises particles and an index matching means which comprises a fluid may be present. In some applications, this has also led to a significant increase in light emittance of the LED.

The invention claimed is:

1. An LED comprising a substrate layer with a first surface and a second surface opposing the first surface and having a refractive index of $n_1$, a light emitting means provided on said first surface, an array of particles arranged on said second surface, and an index matching means on said second surface having a refractive index $n_2$ being $n_2 \geq n_1 - 0.5$ and $n_2 \leq n_1 + 3$, wherein the filling height of the index matching means is lower than the maximum height of the array of particles so that not all the particles are totally covered by the index matching means.

2. The LED according to claim 1, wherein the refractive index of the index matching means $n_2$ is ≧1.0 and ≦4.

3. The LED according to claim 1, wherein a volume filling of the array of particles is ≧50% and ≦90% and/or the index matching means is provided in such a way that ≧30% and ≦100% of the index matching means fills up the array of particles to ≧20% and ≦80% of the height of the array of particles.

4. The LED according to claim 1, wherein the index matching means has an absorption in a wavelength range of ≧380 to ≦700 nm of ≧0 $cm^{-1}$ and ≦1000 $cm^{-1}$.

5. The LED according to claim 1, wherein the index matching means comprises a fluid, and wherein a kinematic viscosity of the fluid before curing is preferably ≧300 cSt to ≦500 cSt, more preferably ≧350 to ≦450 cSt and/or the refractive index at 590 nm preferably is ≧1.40 to ≦1.74, more preferably ≧1.51 to ≦1.63.

6. The LED according to claim 1, wherein the index matching means comprises small particles, and wherein a median diameter of the index matching particles is ≧1 nm and ≦50nm.

7. The LED according to claim 1, wherein the index matching means comprises a fluid and/or particles with a material selected from a group comprising glass, silicone, inorganic materials with a refractive index of ≧1.0 and ≦3.5, inorganic polymers, organic polymers, preferably with a refractive index of ≧1.0 and ≦3.5 or mixtures thereof.

8. The LED according claim 1, wherein the array of particles is provided in such a way that ≧70% to ≦100% of the particles form a single-layered array on the substrate.

9. The LED according to claim 1, wherein particles that form the array of particles have an average diameter which is ≧50 nm and ≦1000 μm.

10. A system comprising a LED according to claim 1, the system being used in one or more of the following applications: being household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, and decorative lighting systems.

11. An LED comprising:
a substrate with a first surface and a second surface opposing the first surface and having a refractive index of $n_1$;
a light emitter located on said first surface;
an index matching means located on said second surface having a refractive index $n_2$ being $n_2 \geq n_1 - 0.5$; and
an array of particles arranged in said index matching means, wherein not all the particles are totally covered by the index matching means.

12. The LED of claim 11, wherein $n_2 \leq n_1 + 3$.

13. The LED of claim 11, wherein a volume filling of the array of particles is ≧50% and ≦90% and/or the index matching means is provided in such a way that ≧30% and ≦100% of the index matching means fills up the array of particles to ≧20% and ≦80% of a height of the array of particles.

14. The LED of claim 11, wherein the index matching means has an absorption in a wavelength range of ≧380 to ≦700 nm of ≧0 $cm^{-1}$ and ≦1000 $cm^{-1}$.

15. The LED of claim 11, wherein the index matching means comprises a fluid, and wherein a kinematic viscosity of the fluid before curing is ≧300 cSt to ≦500 cSt.

16. The LED of claim 11, wherein the index matching means comprises particles having a median diameter of ≧1 nm and ≦50 nm.

17. The LED of claim 11, wherein the index matching means comprises a fluid and/or particles with a material selected from a group comprising glass, silicone, inorganic materials with a refractive index of ≧1.0 and ≦3.5, inorganic polymers, organic polymers or mixtures thereof.

18. The LED of claim 11, wherein the array of particles is provided in such a way that ≧70% to ≦100% of the particles form a single-layered array on the substrate.

19. The LED of claim 11, wherein particles that form the array of particles have an average diameter which is ≧50 nm and ≦1000 μm.

* * * * *